US012813193B2

(12) United States Patent
Choi et al.

(10) Patent No.: US 12,813,193 B2
(45) Date of Patent: Nov. 24, 2026

(54) FAN FILTER UNIT, SUBSTRATE PROCESSING APPARATUS INCLUDING THE SAME, AND METHOD OF PROCESSING SUBSTRATE USING THE SAME

(71) Applicant: SAMSUNG ELECTRONICS CO., LTD., Suwon-si (KR)

(72) Inventors: Dae-Woong Choi, Suwon-si (KR); Hyun-Chul Kim, Suwon-si (KR); Jin Hong Park, Suwon-si (KR); Hyun Mo Kang, Suwon-si (KR); Oh Chel Kwon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 69 days.

(21) Appl. No.: 18/795,440

(22) Filed: Aug. 6, 2024

(65) Prior Publication Data

US 2025/0201590 A1 Jun. 19, 2025

(30) Foreign Application Priority Data

Dec. 19, 2023 (KR) ........................ 10-2023-0186196

(51) Int. Cl.

*H10P 72/00* (2026.01)
*B08B 1/32* (2024.01)

(Continued)

(52) U.S. Cl.

CPC ............ *H10P 72/0414* (2026.01); *B08B 1/32* (2024.01); *H10P 72/3402* (2026.01); *H10P 72/3411* (2026.01); *H10P 72/7602* (2026.01)

(58) Field of Classification Search

None

See application file for complete search history.

(56) References Cited

U.S. PATENT DOCUMENTS 9,305,767 B2 4/2016 Nishi et al.
2014/0137893 A1* 5/2014 Otsuka .................... H10P 70/00 134/30

(Continued)

FOREIGN PATENT DOCUMENTS

JP 2017-118029 A2 6/2017
KR 10-2006-0101303 A 9/2006

(Continued)

OTHER PUBLICATIONS

English Machine Translation for KR-20130025133-A (Year: 2026).*

*Primary Examiner* — Kaj K Olsen
*Assistant Examiner* — Pradhuman Parihar
(74) *Attorney, Agent, or Firm* — MORGAN, LEWIS & BOCKIUS LLP

(57) ABSTRACT

A fan filter unit includes: a housing; a centrifugal fan which rotates inside the housing about a rotary axis that extends in a first direction; a first plate surrounding at least a part of a side surface of the centrifugal fan; and a second plate disposed below the centrifugal fan and the first plate, and including a plurality of micro holes each extending in the first direction, wherein a first airflow path, which extends in the first direction, and a second airflow path, which is connected to a lower part of the first airflow path, are formed between the centrifugal fan and the first plate, and the second airflow path has an inclination with respect to a lower surface of the centrifugal fan.

19 Claims, 11 Drawing Sheets

(51) Int. Cl.
*H10P 72/30* (2026.01)
*H10P 72/76* (2026.01)

(56) References Cited

U.S. PATENT DOCUMENTS

| | | | |
|---|---|---|---|
| 2022/0285192 | A1 | 9/2022 | Hsu et al. |
| 2022/0297167 | A1 | 9/2022 | Park et al. |

FOREIGN PATENT DOCUMENTS

| | | | | | |
|---|---|---|---|---|---|
| KR | 20130025133 | A | * | 3/2013 | ............... G03F 1/60 |
| KR | 10-1394091 | B1 | | 5/2014 | |
| KR | 10-2019-0024380 | A | | 3/2019 | |
| KR | 10-2021-0121463 | A | | 10/2021 | |

* cited by examiner

FAN FILTER UNIT, SUBSTRATE PROCESSING APPARATUS INCLUDING THE SAME, AND METHOD OF PROCESSING SUBSTRATE USING THE SAME

CROSS-REFERENCE TO RELATED APPLICATION

This application claims priority under 35 USC § 119 to Korean Patent Application No. 10-2023-0186196, filed on Dec. 19, 2023 in the Korean Intellectual Property Office, the disclosure of which is incorporated by reference herein in its entirety.

TECHNICAL FIELD

Embodiments of the present inventive concept relate to a fan filter unit, a substrate processing apparatus including the same, and a method of processing a substrate using the same.

DISCUSSION OF THE RELATED

To manufacture a semiconductor device having a minute circuit pattern formed thereon, various unit processes such as a deposition process, a lithography process, an etching process, and an ion implantation process may be performed. Furthermore, after each unit process is completed and before the next unit process is performed, a cleaning process and a drying process for removing contaminants that are remaining on a surface of the substrate (for example, a wafer) may be performed. In addition, as line widths of circuit patterns continue to decrease, a drying process by using supercritical fluid has been adopted in recent years.

In addition, a fan filter unit (FFU) may be provided above the process chamber to maintain the cleanliness of the process chamber. The fan filter unit may provide a downward airflow caused by purified air that is within the process chamber, and contaminants that are generated within the process chamber may be emitted to the outside along the downward airflow.

SUMMARY

According to embodiments of the present inventive concept, a fan filter unit includes: a housing; a centrifugal fan which rotates inside the housing about a rotary axis that extends in a first direction; a first plate surrounding at least a part of a side surface of the centrifugal fan; and a second plate disposed below the centrifugal fan and the first plate, and including a plurality of micro holes each extending in the first direction, wherein a first airflow path, which extends in the first direction, and a second airflow path, which is connected to a lower part of the first airflow path, are formed between the centrifugal fan and the first plate, and the second airflow path has an inclination with respect to a lower surface of the centrifugal fan.

According to embodiments of the present inventive concept, a fan filter unit includes: a housing; a centrifugal fan disposed inside the housing, and including a motor, a blower, and an airflow guide unit, wherein the motor has a rotary axis that extends in a first direction, wherein the blower rotates by the motor, and the airflow guide unit includes a first inclined surface extending downward from an outer peripheral part of the blower; a first plate including an opposite surface and a second inclined surface, wherein the opposite surface is opposite to a side surface of the blower, and the second inclined surface is opposite to the first inclined surface; and a second plate disposed below the centrifugal fan and the first plate, and including a plurality of micro holes each extending in the first direction, wherein a first interior angle that is formed between a lower surface of the airflow guide unit and the first inclined surface is an obtuse angle.

According to embodiments of the present inventive concept, a substrate processing apparatus includes: a chamber body providing a process space; a substrate support configured to support a substrate, inside the process space; a processing liquid supply nozzle configured to supply a processing liquid onto the substrate; an exhaust port connected to the chamber body; and a fan filter unit connected to the chamber body, wherein the fan filter unit includes: a centrifugal fan which rotates around a rotary axis that extends in a first direction; a first plate surrounding at least a part of a side surface of the centrifugal fan; a second plate disposed between the process space and the centrifugal fan and between the process space and the first plate, and including a plurality of micro holes each extending in the first direction; a first airflow path extending in the first direction and formed between the centrifugal fan and the first plate; and a second airflow path connected to the first airflow path and formed between the first airflow path and the second plate, wherein the second airflow path has an inclination with respect to the first airflow path and is formed between the centrifugal fan and the first plate.

BRIEF DESCRIPTION OF THE DRAWINGS

The above and other aspects and features of the present inventive concept will become more apparent by describing in detail example embodiments thereof with reference to the attached drawings, in which.

DETAILED DESCRIPTION OF THE EMBODIMENTS

Hereinafter, a fan filter unit and a substrate processing apparatus including the same according to embodiments of the present inventive concept will be described with reference to FIGS. 1 to 8.

Figure 1:
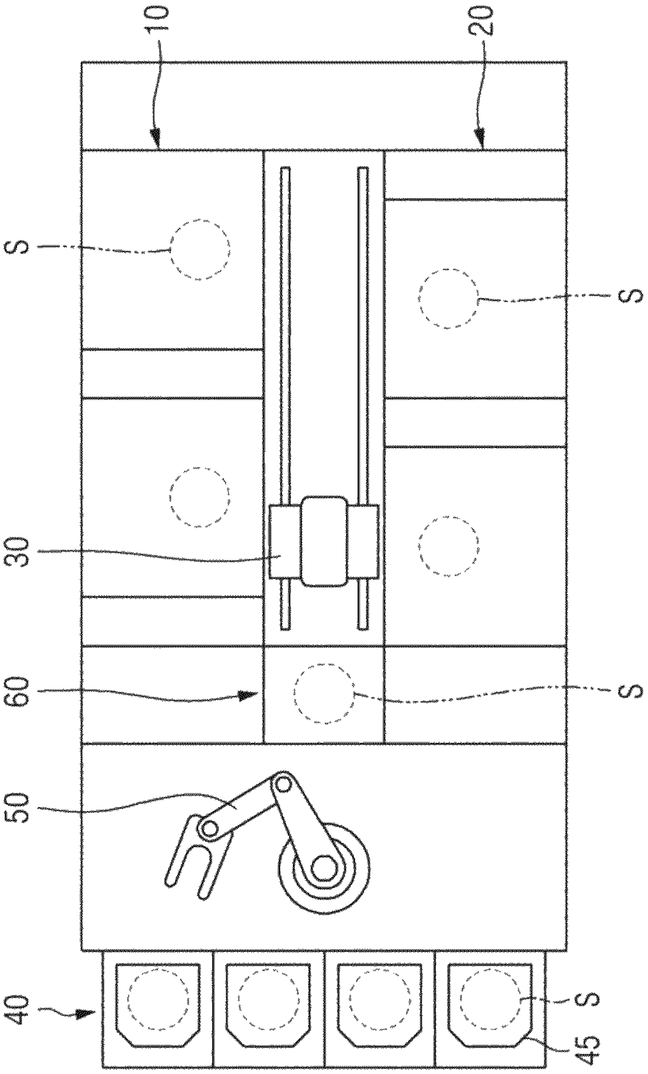
FIG. 1 is a schematic configuration diagram illustrating the substrate processing apparatus according to embodiments of the present inventive concept.

FIG. 1 is a schematic configuration diagram illustrating the substrate processing apparatus according to embodiments of the present inventive concept.

The substrate processing apparatus according to embodiments of the present inventive concept may be an apparatus that processes a substrate (for example, a wafer) in a manufacturing process of the semiconductor device. For example, the substrate processing apparatus may perform a cleaning process and a drying process on the substrate. However, the substrate processing apparatus does not only perform the cleaning process and the drying process, but may also perform various unit processes (for example, a lithography process or an etching process) prior to the cleaning process and the drying process.

Referring to FIG. 1, the substrate processing apparatus according to embodiments of the present inventive concept may include a first process module 10, a second process module 20, a transfer module 30, a load port 40, an interface module 50, and a stage unit 60.

The first process module 10 and the second process module 20 may sequentially perform processes on one substrate S. For example, the first process module 10 may perform a cleaning process on the substrate S, and the second process module 20 may perform a drying process on the substrate S that has been subjected to the cleaning process. The number, placement, and the like of the first process module 10 and the second process module 20 are merely examples, and the present inventive concept is not limited to the shown example.

In embodiments of the present inventive concept, the cleaning process may utilize a wetting solution. The wetting solution may be used to reduce a surface tension of a liquid (e.g., pure water) applied to the surface of the substrate S in the procedure of performing the cleaning process. For example, the wetting solution may include, but is not limited to, at least one of isopropyl alcohol (IPA), isopropyl alcohol aqueous solution, a mixed solution of surfactant and water, or combinations thereof.

In embodiments of the present inventive concept, the drying process may utilize a supercritical fluid. The supercritical fluid may be a fluid that has a temperature and pressure above a critical point, has gas-like diffusivity, viscosity, and surface tension, and may have solubility like liquid. Accordingly, the supercritical fluid may dry the substrate S by replacing the wetting solution without damaging the minute circuit patterns that are formed on the substrate S.

The transfer module 30 may be disposed between the first process module 10 and the second process module 20. The transfer module 30 may take out the substrate S from the first process module 10, and transfer it to the second process module 20. For example, the transfer module 30 may include a transfer robot. Unlike the shown example, two or more transfer modules 30 may be provided. Although the first process module 10, the second process module 20, and the transfer module 30 are only shown as being disposed in the form of a track, this is only an example, and the first process module 10, the second process module 20 and the transfer modules 30 may be disposed in the form of a cluster. For example, the transfer robot may include a motor to enable travel along the track.

The load port 40 may provide a space in which a container 45 is provided, and the container 45 may accommodate a plurality of substrates S. The container 45 may be, for example, a FOUP. The interface module 50 may transfer the substrate S from the container 45 to the first process module 10. Furthermore, the interface module 50 may transfer the substrates S from the second process module 20 to the container 45. For example, the interface module 50 may be a mechanical arm with joints that is configured to move the substrates S. The stage unit 60 may be disposed between the interface module 50 and the transfer module 30. The stage unit 60 may be provided to temporarily accommodate the substrate S that is to be processed in the first process module 10 or the substrate S that is to be processed in the second process module 20.

Figure 2:
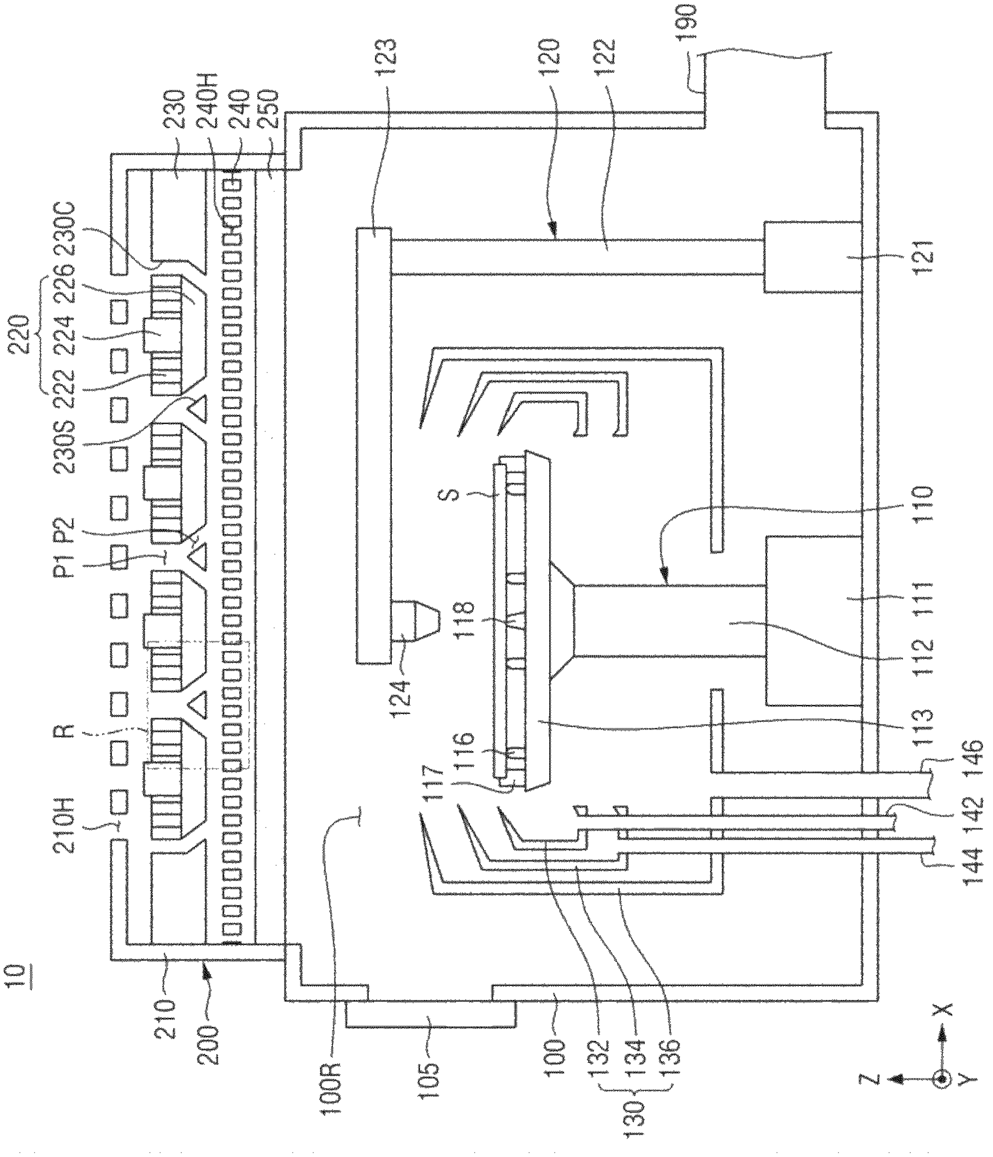
FIG. 2 is a schematic cross-sectional view illustrating the first process module of the substrate processing apparatus according to embodiments of the present inventive concept.
Figure 3:
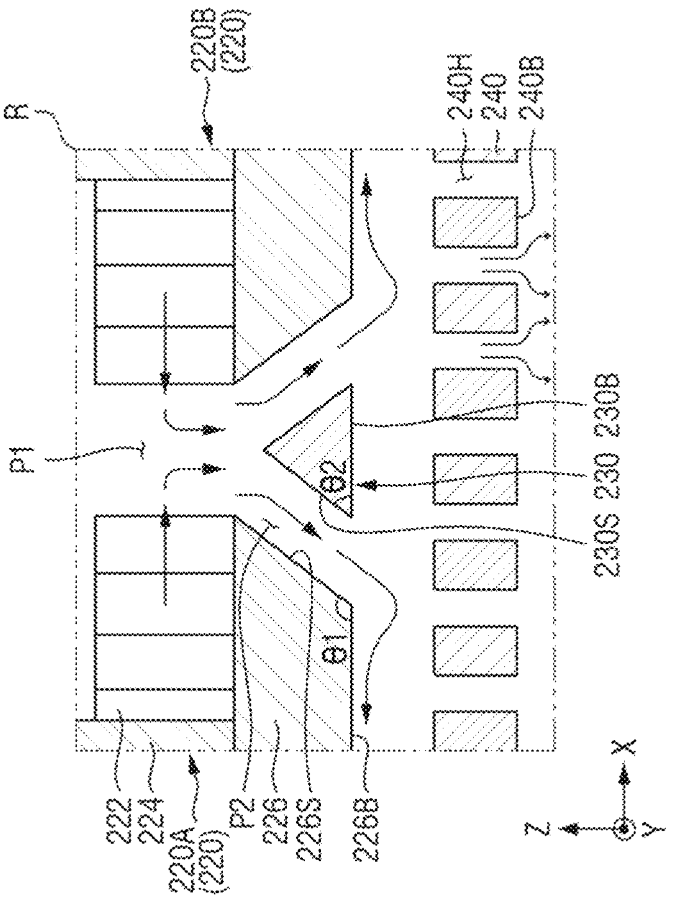
FIG. 3 is an enlarged view illustrating a region R of FIG. 2.
Figure 4:
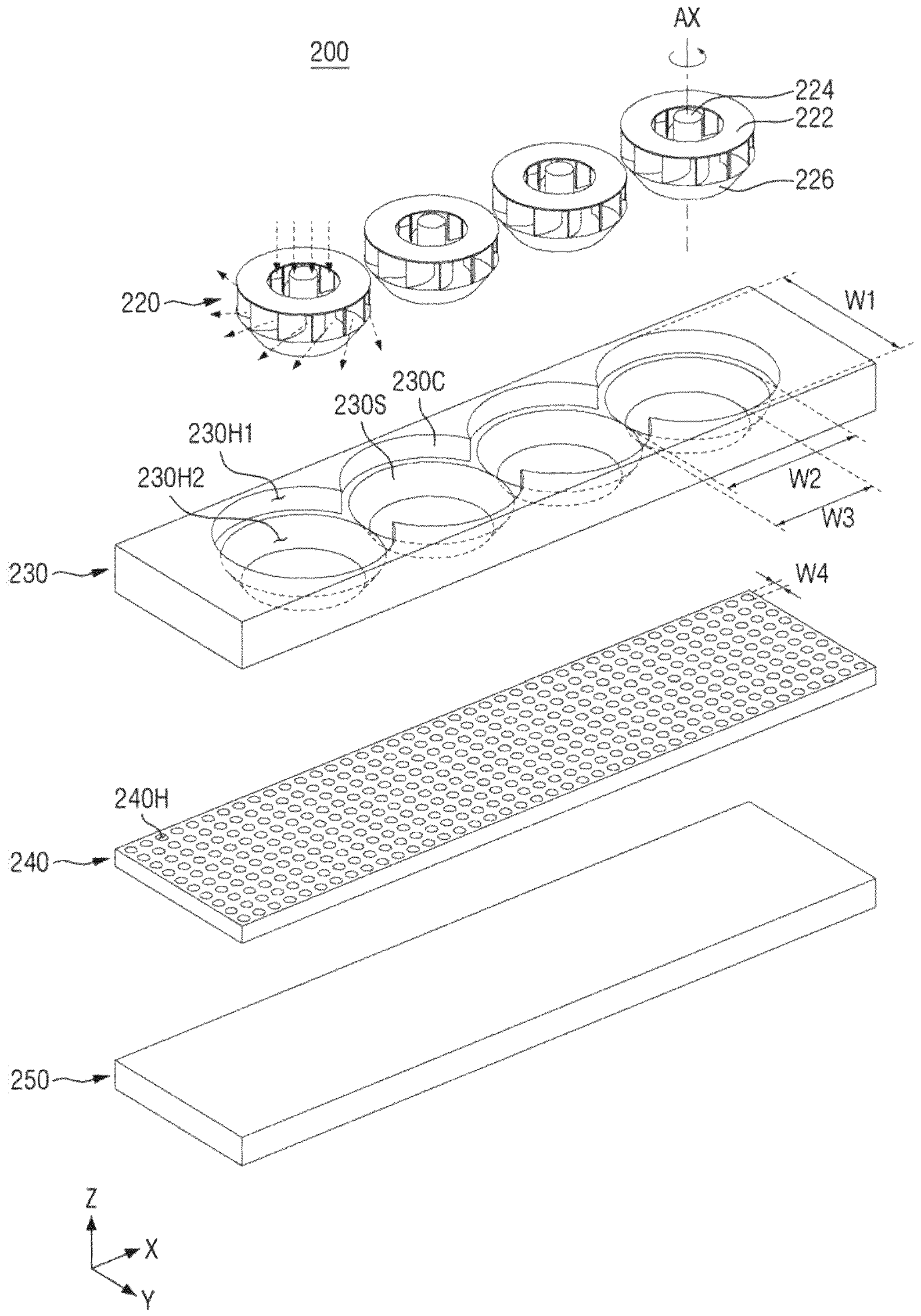
FIG. 4 is a partially exploded perspective view illustrating the fan filter unit of FIG. 2.

FIG. 2 is a schematic cross-sectional view illustrating the first process module of the substrate processing apparatus according to embodiments of the present inventive concept. FIG. 3 is an enlarged view illustrating a region R of FIG. 2. FIG. 4 is a partially exploded perspective view illustrating the fan filter unit of FIG. 2.

Referring to FIGS. 2 to 4, the first process module 10 of the substrate processing apparatus according to embodiments of the present inventive concept includes a chamber body 100, a substrate support 110, a processing liquid supply nozzle 120, a bowl 130, an exhaust port 190, and a fan filter unit 200.

The chamber body 100 provides a process space 100R for processing the substrate S, and may separate the process space 100R from the outside. In embodiments of the present inventive concept, the chamber body 100 may provide the process space 100R for performing a wetting process on the substrate S. An overall external structure of the chamber body 100 may be various shapes, such as, but not limited to, a cylindrical shape, an elliptical cylinder shape, or a polygonal cylinder shape. The chamber body 100 may include, for example, but is not limited to, a metal material such as aluminum (Al).

The chamber body 100 may be provided with a shutter door 105. The substrate S may be carried into the process space 100R through the shutter door 105, or may be carried out of the process space 100R through the shutter door 105. The shutter door 105 may be opened and closed by, for example, but not limited to, a linear movement, a rotational movement or a combination thereof in a vertical direction (for example, a first direction Z), a front-rear direction (for example, a second direction X) and/or a left-right direction (for example, a third direction Y).

The substrate support 110 may be placed inside the chamber body 100. The substrate S may be placed on and supported by the substrate support 110. The substrate support 110 may rotate the substrate S. For example, the substrate support 110 may include a rotary driver 111, a chuck support shaft 112, and a spin chuck 113.

The spin chuck 113 may have a plate shape or cylindrical shape with a relatively small thickness for supporting the substrate S. For example, the spin chuck 113 may have a disk shape having a larger area than that of the substrate S. The substrate S may be placed on the upper face of the spin chuck 113.

The rotary driver 111 may provide a rotational power. For example, the rotary driver 111 may include, but is not limited to, a motor. The rotary driver 111 may be configured to receive and transmit the rotational power from and to the outside.

The chuck support shaft 112 may connect the rotary driver 111 and the spin chuck 113 to each other. For example, the chuck support shaft 112 may extend in the vertical direction (for example, the first direction Z). The chuck support shaft 112 may receive the rotational power from the rotary driver 111 to rotate the spin chuck 113. The substrate S placed on the spin chuck 113 may rotate, accordingly.

In embodiments of the present inventive concept, substrate support 110 may include a pin chuck. For example, the substrate support 110 may further include a support pin 116, a fixing pin 117, and a lift pin 118 on the upper face of the spin chuck 113.

The support pin 116 may protrude from the upper face of the spin chuck 113 and support the lower face of the substrate S. For example, the substrate S may be spaced apart from the upper face of the spin chuck 113 by the support pins 116. A plurality of support pins 116 may be provided. For example, the plurality of support pins 116 may be disposed to be spaced apart from each other in a radial direction of the spin chuck 113. Furthermore, for example, the plurality of support pins 116 may be spaced apart from each other and arranged along a circumference on the spin chuck 113. The substrate S may be supported by the plurality of support pins 116.

The fixing pin 117 may protrude from the upper face of the spin chuck 113 and support the side part of the substrate S. For example, the fixing pin 117 may be adjacent to an edge of the spin chuck 113, and may be disposed between the edge of the spin chuck 113 and the support pins 116. For example, the fixing pin 117 may support an edge of the substrate S. When the substrate S is rotated by the spin chuck 113, the fixing pins 117 may prevent the substrate S from being separated from the spin chuck 113 due to a centrifugal force. A plurality of fixing pins 117 may be provided on the spin chuck 113. For example, the plurality of fixing pins 117 may be spaced apart from each other, and arranged along the circumferential direction of the spin chuck 113. In embodiments of the present inventive concept, the fixing pin 117 may be configured to be movable in a radial direction of the spin chuck 113. The fixing pins 117 may be in contact with the substrate S when loading the substrate S, or may be spaced apart from the substrate S when unloading the substrate S.

A lift pin 118 may protrude from the upper face of the spin chuck 113. The lift pin 118 may be configured to move up and down in the vertical direction (for example, in the first direction Z). The lift pin 118 may space the substrate S from the support pins 116 when the substrate S is unloaded, or may place the substrate S on the support pins 116 when the substrate S is loaded.

The processing liquid supply nozzle 120 may supply a processing liquid onto the substrate S. The processing liquid may include at least one of various fluids for processing the substrate S, for example, but not limited to, an organic solvent, an acid solution, an alkaline solution, pure water or a mixture thereof.

A plurality of processing liquid supply nozzles 120 may be provided to supply different processing liquids. As an example, some of the plurality of processing liquid supply nozzles 120 may provide a chemical liquid for a processing process on the substrate S (for example, a developer for a lithography process, an etching liquid for an etching process, etc.). As an example, some others of the plurality of processing liquid supply nozzles 120 may provide the chemical liquid, pure water, and/or wetting solution for the cleaning process on the substrate S.

The processing liquid supply nozzle 120 uniformly supplies the processing liquid from a center region to edge regions of the substrate S. For example, the processing liquid supply nozzle 120 may include a shaft driver 121, a nozzle support shaft 122, a nozzle arm 123, and an injection nozzle 124. The shaft driver 121 may provide power for operating the processing liquid supply nozzle 120. The nozzle support shaft 122 may connect the shaft driver 121 and the nozzle arm 123 to each other. For example, the nozzle support shaft 122 may extend in the vertical direction (for example, in the first direction Z). The nozzle arm 123 may connect the nozzle support shaft 122 and the injection nozzle 124 to each other. The injection nozzle 124 is moved by power that is supplied from the shaft driver 121, and may supply the processing liquid onto the substrate S.

A bowl 130 may be placed on an outer wall of the substrate support 110. The bowl 130 may be formed to be higher than the substrate support 110 and the substrate S. The bowl 130 may be configured to wrap around the outer wall of the substrate support 110 with an upper part thereof open. The bowl 130 may block the processing liquid, which is supplied onto the substrate S, and the fumes, which are obtained by vaporizing the processing liquid, from flowing to the outside.

In embodiments of the present inventive concept, the bowl 130 may include a plurality of recovery barrels 132, 134 and 136 that may separate and recover a plurality of processing liquids. Each of the recovery barrels 132, 134 and 136 may recover different types of processing liquid from each other. For example, the bowl 130 may include a first recovery barrel 132, a second recovery barrel 134, and a third recovery barrel 136. The first recovery barrel 132 may wrap around the spin chuck 113. The second recovery barrel 134 may wrap around the first recovery barrel 132, and the third recovery barrel 136 may wrap around the second recovery barrel 134. The shape, number, and the like of the recovery barrels 132, 134 and 136, which are included in the bowl 130, are merely example, and may be changed as necessary.

Outlets 142, 144 and 146 may be connected to the lower parts of the recovery barrels 132, 134 and 136, respectively. The processing liquids that have flowed into the recovery barrels 132, 134 and 136 may be emitted and recovered through the outlets 142, 144 and 146. For example, a first outlet 142 is connected to the space that is inside the first recovery barrel 132. A second outlet 144 is connected to the space that is inside the second recovery barrel 134, and a third outlet 146 is connected to the space that is inside the third recovery barrel 136.

The exhaust port 190 may be connected to the lower part of the chamber body 100. For example, the exhaust port 190 may be connected to a lower side face of the chamber body 100 or a lower face of the chamber body 100. Air within the process space 100R may be emitted to the outside of the chamber body 100 through the exhaust port 190. For example, the exhaust port 190 may be connected to a pump to transfer air from inside the process space 100R to the outside.

The fan filter unit 200 may be connected to the upper part of the chamber body 100. For example, the fan filter unit 200 may be connected to the upper face of the chamber body 100. The fan filter unit 200 may purify external air and allow it to flow into the process space 100R. The air emitted from the process space 100R through the exhaust port 190 is purified through the fan filter unit 200, and may flow into the process space 100R again.

The fan filter unit 200 may include a housing 210, a centrifugal fan 220, a first plate 230, a second plate 240, and a filter 250.

The housing 210 may provide a space for accommodating the centrifugal fan 220, the first plate 230, the second plate 240, and the filter 250. The housing 210 may be connected to the upper part of the chamber body 100 and fixed onto the chamber body 100. The housing 210 may include a metal material such as, but not limited to, for example, aluminum (Al).

The housing 210 may include inlets 210H through which external air flows. In embodiments of the present inventive concept, the inlets 210H may be provided in the upper part of the housing 210.

The centrifugal fan 220 may be disposed in the housing 210. The centrifugal fan 220 rotates around the rotary axis AX, and may pump air in a direction intersecting the rotary axis AX, using a centrifugal force due to rotation of the centrifugal fan 220. The centrifugal fan 220 may form a downward airflow toward the process space 100R from the air that is flowing in from the inlet 210H.

In embodiments of the present inventive concept, a plurality of centrifugal fans 220 may be disposed in the housing 210. The plurality of centrifugal fans 220 may be arranged to be adjacent to each other. For example, the plurality of centrifugal fans 220 may be arranged in a line along the second direction X that intersects the first direction Z.

The centrifugal fan 220 may include a blower unit 222 (e.g., a blower), a motor unit 224 (e.g., a motor), and an airflow guide unit 226.

The motor unit 224 may rotate about the rotary axis AX extending in the first direction Z. The motor unit 224 may be an AC motor or a DC motor.

The blower unit 222 may be connected to the motor unit 224. The blower unit 222 may be a centrifugal blower. For example, the blower unit 222 may surround the moto unit 224. For example, the blower unit 222 may receive the rotational force from the motor unit 224 and rotate around the rotary axis AX, and may pump air in a direction intersecting the rotary axis AX (for example, a direction in the X-Y plane). The blower unit 222 may be a forward-curved centrifugal type blower or a backward-curved centrifugal type blower.

An airflow guide unit 226 may be disposed below the blower unit 222. The airflow guide unit 226 may include a first inclined face 226S extending downward from the outer circumference of the blower unit 222. A first interior angle θ1 formed by the lower face 226B of the airflow guide unit 226 and the first inclined face 226S may be an obtuse angle. For example, the airflow guide unit 226 may have a truncated cone structure whose width decreases as it extends away from the blower unit 222.

The first plate 230 may be disposed inside the housing 210. The first plate 230 may have a plate-like structure extending in a plane (for example, an X-Y plane) intersecting the first direction Z. For example, the first plate 230 may have a rectangular cuboid shape. The first plate 230 may surround at least a part of a side face of the centrifugal fan 220. For example, the first plate 230 may include plate holes 230H1 and 230H2 extending in the first direction Z, and at least a part of the centrifugal fan 220 may be placed inside the plate holes 230H1 and 230H2. The first plate 230 may include, for example, but is not limited to, a metal material such as aluminum (Al).

The first plate 230 may control the flow of air pumped by the centrifugal fan 220. For example, a first airflow path P1 and a second airflow path P2 may be formed between the centrifugal fan 220 and the first plate 230. The first airflow path P1 may extend in a first direction Z along a side face of the centrifugal fan 220. The second airflow path P2 is connected to a lower part of the first airflow path P1, and may have an inclination with respect to the lower face (e.g., the first inclined face 226S) of the centrifugal fan 220.

For example, the plate holes 230H1 and 230H2 may include a first airflow hole 230H1 and a second airflow hole 230H2.

The first airflow hole 230H1 may extend from the upper face of the first plate 230. An opposite face 230C, which extends in the first direction Z inside the upper part of the first plate 230, may define the first airflow hole 230H1. At least a part of the blower unit 222 of the centrifugal fan 220 may be disposed inside the first airflow hole 230H1, and the opposite face 230C of the first plate 230 may be opposite to the side face of the blower unit 222. Therefore, a first airflow path P1, which is defined by the side face of the blower part 222 and the opposite face 230C of the first plate 230 and extends in the first direction Z, may be formed inside the first airflow hole 230H1.

In embodiments of the present inventive concept, a part of the first airflow path P1 may be formed between adjacent centrifugal fans 220. For example, a part of the first airflow path P1 may be defined between the blower unit 222 of one centrifugal fan 220 and the blower unit 222 of another centrifugal fan 220 adjacent thereto. In embodiments of the present inventive concept, the first plate 230 might not be interposed between the blower unit 222 of one centrifugal fan 220 and the blower unit 222 of another centrifugal fan 220 adjacent thereto.

The second airflow hole 230H2 may extend from the lower part of the first airflow hole 230H1 to the lower face 230B of the first plate 230. The second inclined face 230S, which is inside the lower part of the first plate 230, may define the second airflow hole 230H2. A second interior angle θ2 formed between the lower face 230B of the first plate 230 and the second inclined face 230S may be an acute angle. For example, the second airflow hole 230H2 may be a truncated cone type hole whose width decreases as it extends away from the first airflow hole 230H1. At least a part of the airflow guide unit 226 of the centrifugal fan 220 may be disposed in the second airflow hole 230H2, and the second inclined face 230S of the first plate 230 may be opposite to the first inclined face 226S of the airflow guide unit 226. As a result, a second airflow path P2, which is defined by the first inclined face 226S of the airflow guide unit 226 and the second inclined face 230S of the first plate 230, and has an inclination with respect to the lower face of the centrifugal fan 220, may be formed inside the second airflow hole 230H2.

In embodiments, the first inclined face 226S and the second inclined face 230S may be parallel to each other. For example, the sum of the first interior angle θ1 and the second interior angle θ2 may be 180°.

In embodiments of the present inventive concept, at a boundary between the first airflow hole 230H1 and the second airflow hole 230H2, a width W1 of the first airflow hole 230H1 may be greater than an upper width W2 of the second airflow hole 230H2. Since the width of the second airflow hole 230H2 may decrease as it extends away from the first airflow hole 230H1, a lower width W3 of the second airflow hole 230H2 may be smaller than the upper width W2 of the second airflow hole 230H2.

As shown in FIG. 3, the airflow generated by the centrifugal fan 220 may flow in the vertical direction (e.g., −Z direction) through the first airflow path P1. Subsequently, the airflow that has passed through the first airflow path P1 may flow obliquely through the second airflow path P2. Furthermore, the airflow that has passed through the second airflow path P2 may be emitted obliquely, and may be refracted toward the lower face 226B of the airflow guide unit 226. This may be understood as a Coanda effect due to the airflow obliquely emitted from a region adjacent to the lower face 226B of the airflow guide unit 226. Accordingly, the first plate 230 may guide airflow, which flows in the vertical direction (for example, in-Z direction), in the horizontal direction (for example, a direction inside the X-Y plane).

In embodiments of the present inventive concept, the inclination of the airflow guide 226 (e.g., the acute angle formed between the lower face 230B of the first plate 230 and the second airflow path P2) may be about 20° to about 45°. For example, the first interior angle θ1 may be about 135° to about 160°. As an additional example, the second interior angle θ2 may be about 20° to about 45°. In the above range, the Coanda effect due to the second airflow path P2 may be effectively induced.

In embodiments of the present inventive concept, the lower face of centrifugal fan 220 and lower face 230B of first plate 230 may be disposed on the same plane as each other.

The second plate 240 may be disposed inside the housing 210. The second plate 240 may be placed below the centrifugal fan 220 and the first plate 230. For example, the second plate 240 may be disposed between the centrifugal fan 220 and the process space 100R, and between the first plate 230 and the process space 100R. The second plate 240 may have a plate-like structure extending in a plane (for example, X-Y plane) intersecting the first direction Z. For example, the second plate 240 may have a rectangular cuboid shape. The second plate 240 may be disposed to be spaced apart from each of the centrifugal fan 220 and the first plate 230 in the first direction Z.

The second plate 240 may include a plurality of micro holes 240H each extending in the first direction Z. The plurality of micro holes 240H may be formed throughout the second plate 240. Although the plurality of micro holes 240H are only shown as being disposed in a lattice pattern, this is merely an example, and for example, the plurality of micro holes 240H may be disposed in various other shapes or arrangements such as a honeycomb shape.

As shown in FIG. 3, the airflow guided in the horizontal direction (for example, a direction in the X-Y plane) by the centrifugal fan 220 and the first plate 230 is divided by a plurality of micro holes 240H and may pass through the second plate 240. Furthermore, the airflow that has passed through the plurality of micro holes 240H may be refracted toward the lower face of the second plate 240. This may be understood as a Coanda effect due to the airflows emitted from the adjacent micro holes 240H in the region adjacent to the lower face of the second plate 240. Accordingly, the second plate 240 may emit the airflow which is distributed in the horizontal direction (for example, a direction in the X-Y plane) and weakens in the vertical direction (for example, −Z direction). For example, the velocity of the airflow emitted from the second plate 240 in the vertical direction (e.g., −Z direction) may be about 0.25 m/s or less. In embodiments of the present inventive concept, the velocity of the airflow emitted from the second plate 240 in the vertical direction (e.g., −Z direction) may be at a windless level (e.g., about 0.15 m/s or less).

In embodiments of the present inventive concept, a width W4 of each micro hole 240H may be about 5 mm or less. In this range, a weak airflow may be effectively emitted from the second plate 240 in the vertical direction (for example, −Z direction). In embodiments of the present inventive concept, the width W4 of each micro hole 240H may be about 1 mm or less.

In embodiments of the present inventive concept, the number of each micro hole 240H may be at least 10,000 per square meter.

The filter 250 may be disposed inside the housing 210. The filter 250 may be placed below the centrifugal fan 220 and the first plate 230. For example, the filter 250 may be disposed between the centrifugal fan 220 and the process space 100R, and between the first plate 230 and the process space 100R. In embodiments of the present inventive concept, the filter 250 may be disposed between the second plate 240 and the process space 100R.

The airflow that has passed through the filter 250 is purified and may flow into the process space 100R. The filter 250 may include, but is not limited to, at least one of a HEPA (High Efficiency Particulate Air) filter or an ULPA (Ultra Low Penetration Air) filter. In addition, the filter 250 may further include a chemical filter that may trap chemicals.

A fan filter unit (FFU) may be installed above the process chamber to maintain the cleanliness of the process chamber. The fan filter unit may form a downward airflow due to purified air inside the process chamber, and contaminants generated in the process chamber may be emitted to the outside along the downward airflow.

However, a stagnation region in which contaminants are not emitted but are recirculated may occur inside the process chamber, depending on the installation conditions of the fan filter unit. Although the exhaust pressure by the fan filter unit may be increased to remove such a stagnation region, this may cause defects in the unit process performed inside the process chamber. For example, the downward airflow increased by the fan filter unit may cause a drying failure that dries some of the wetting solution (e.g., IPA) that is applied onto the surface of the substrate S in the cleaning process. Such drying defects may cause leaning or the like of the minute circuit patterns formed on the substrate S, thereby increasing the defective rate.

In contrast, the fan filter unit 200 of the substrate processing apparatus according to embodiments of the present inventive concept may generate controlled airflow in a vertical direction (e.g., a first direction Z). For example, as described above, the fan filter unit 200 may generate an airflow which is distributed in the horizontal direction (for example, a direction in the X-Y plane) and weakens in the vertical direction (for example, −Z direction), by the use of the first plate 230 and the second plate 240. In embodiments of the present inventive concept, the fan filter unit 200 may generate airflow of a windless level (e.g., about 0.15 m/s or less). This makes it possible to provide a substrate processing apparatus with increased productivity without causing a stagnation region.

Figure 5:
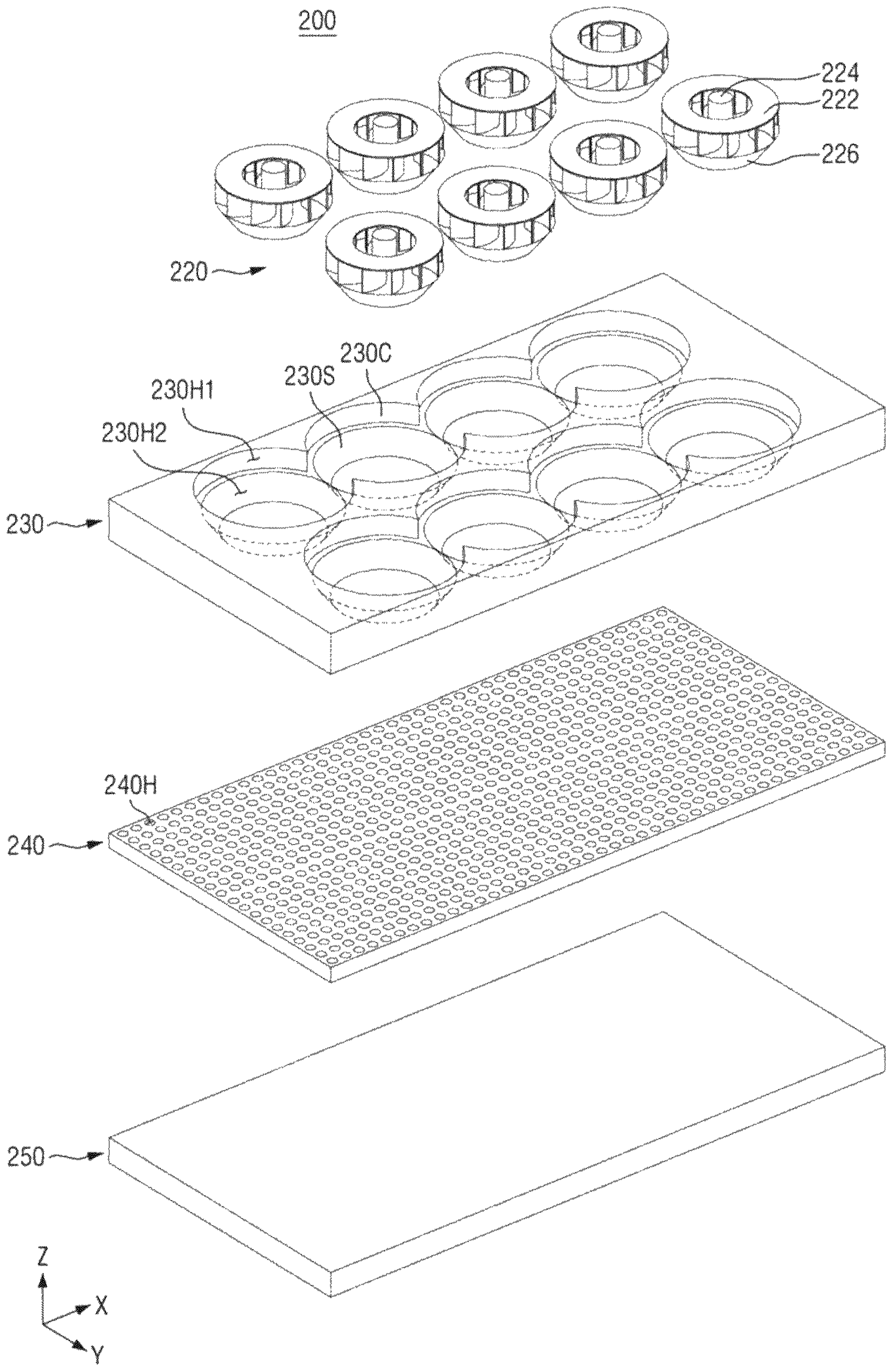
FIG. 5 is a partially exploded perspective view illustrating the fan filter unit of the substrate processing apparatus according to embodiments of the present inventive concept.

FIG. 5 is another partially exploded perspective view illustrating the fan filter unit of the substrate processing apparatus according to embodiments of the present inventive concept. For convenience of explanation, repeated parts and/or descriptions of those described above with regard to FIGS. 1 to 4 may be briefly explained or omitted.

Referring to FIG. 5, in the substrate processing apparatus according to embodiments, the fan filter unit 200 may include centrifugal fans 220 arranged two-dimensionally.

For example, the plurality of centrifugal fans 220 may be arranged two-dimensionally inside a plane including the second direction X and the third direction Y. Although only eight centrifugal fans 220 are shown as being arranged in a lattice pattern, this is merely an example, and the form and number of centrifugal fans 220 arranged may vary.

Figure 6:
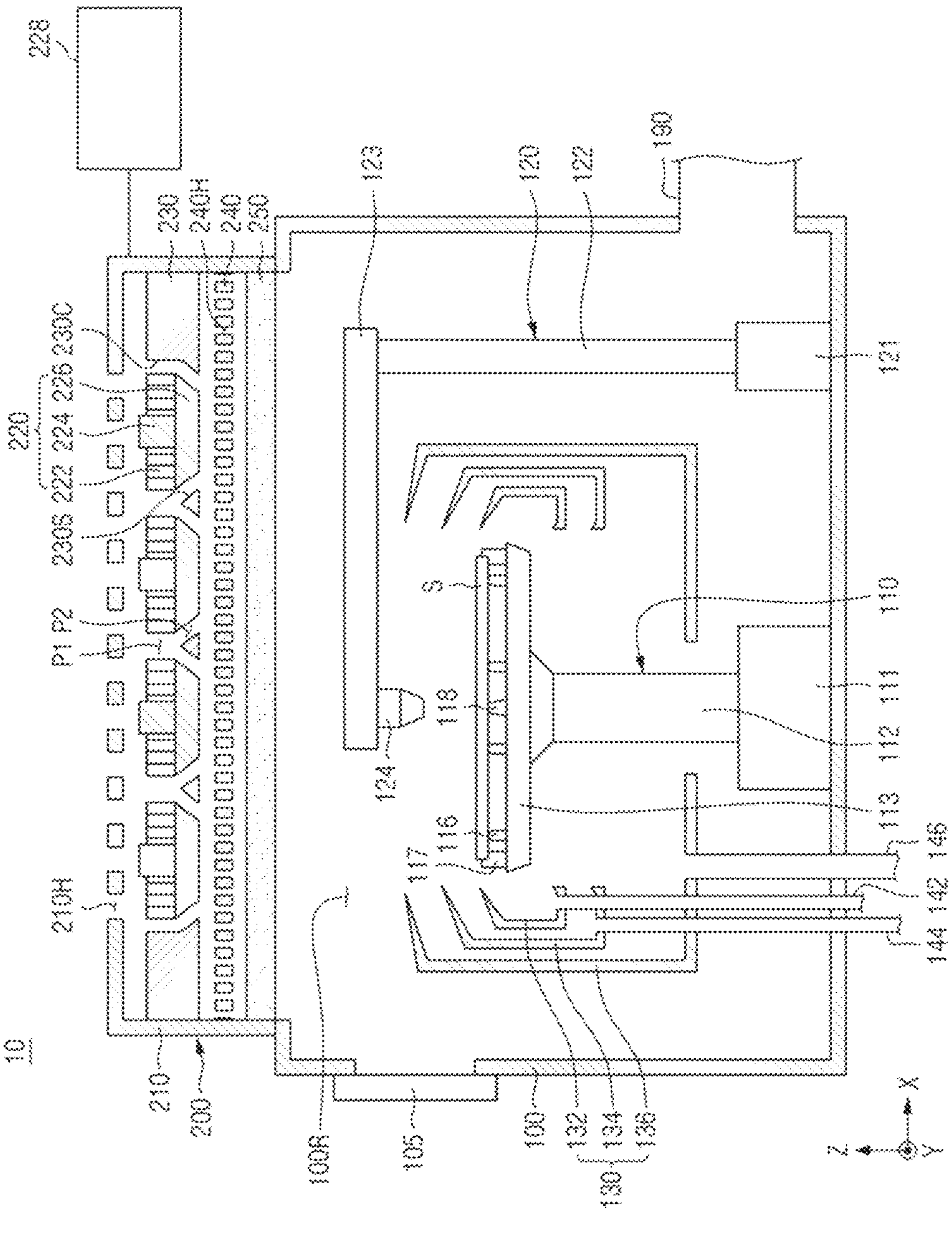
FIGS. 6, 7 and 8 are schematic cross-sectional views illustrating a first process module of a substrate processing apparatus according to embodiments of the present inventive concept.
Figure 7:
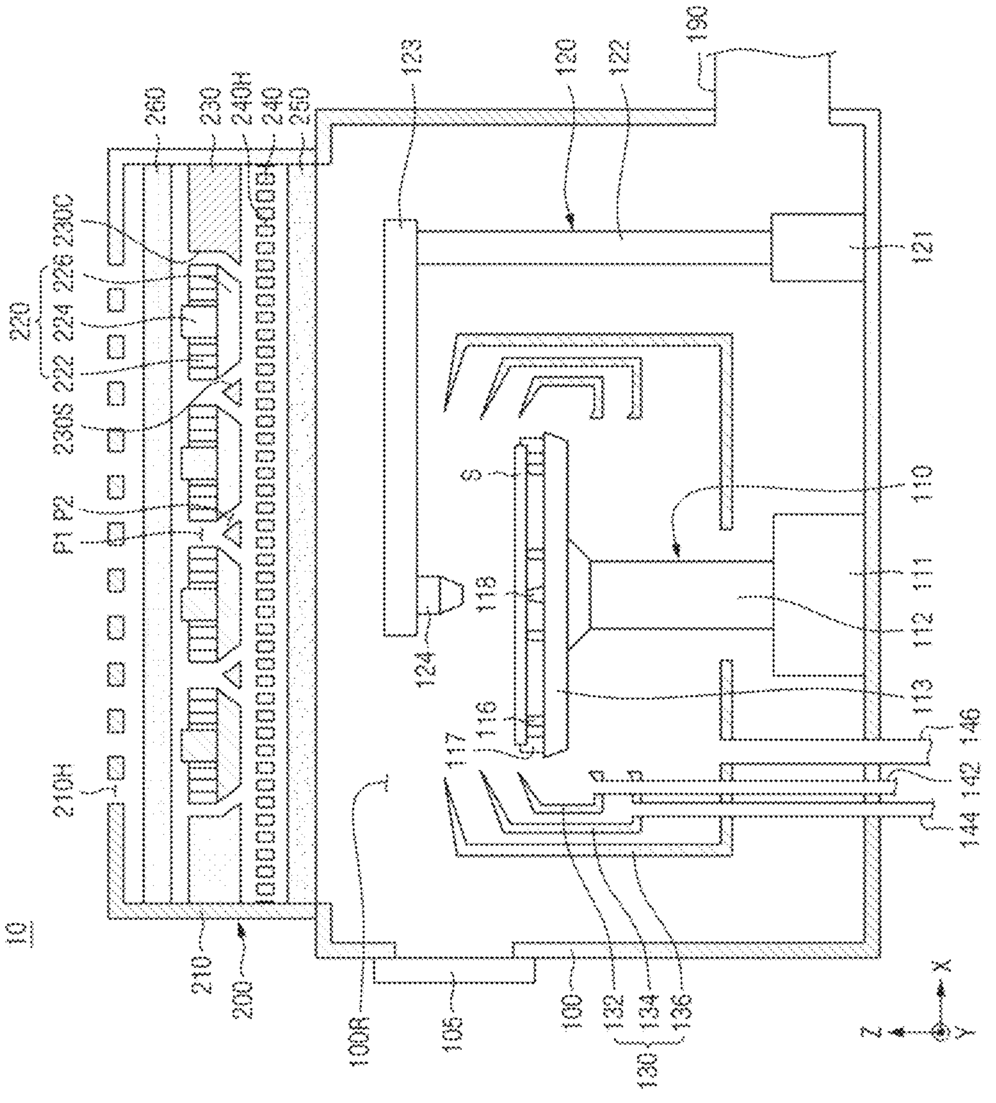
Figure 8:
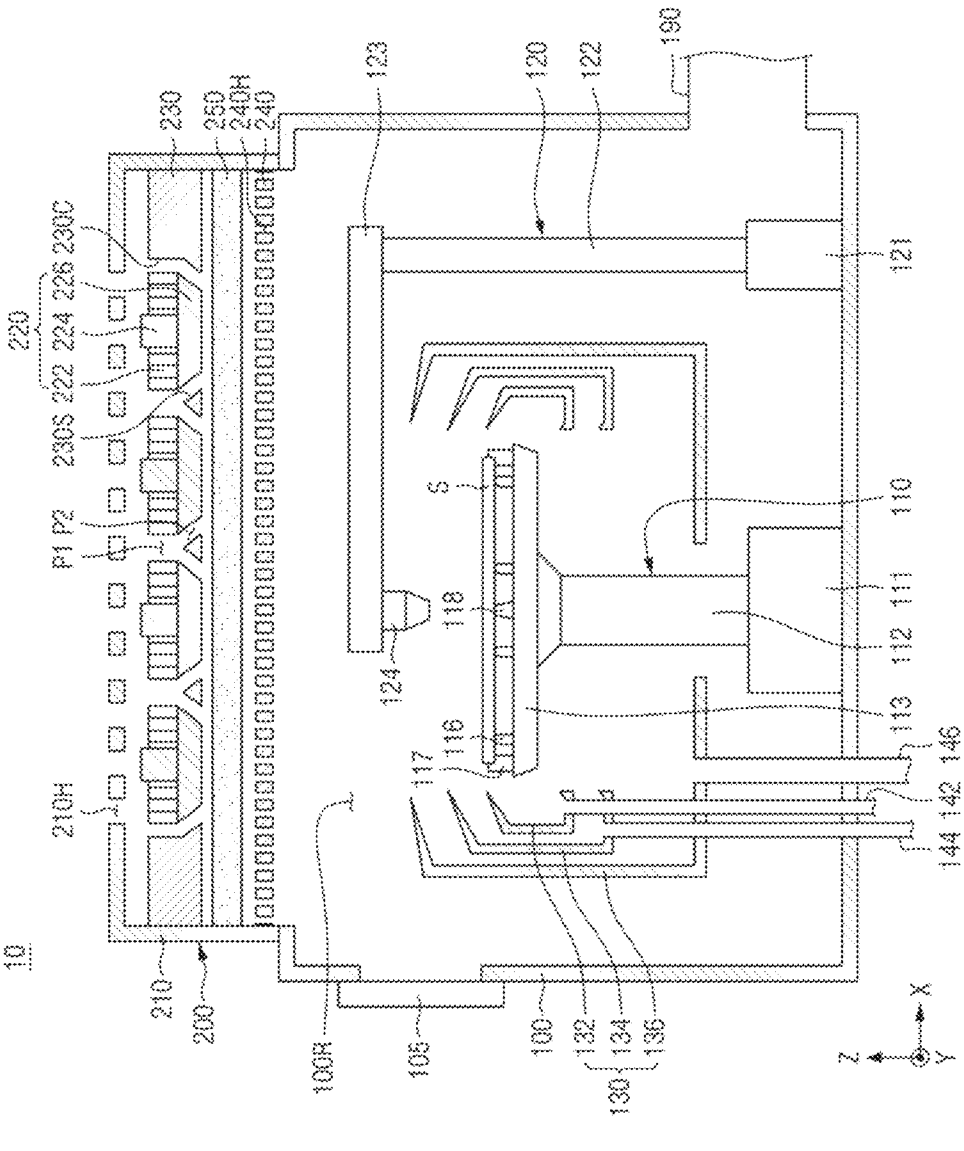

FIGS. 6 to 8 are schematic cross-sectional views illustrating a first process module of a substrate processing apparatus according to embodiments of the present inventive concept. For convenience of explanation, repeated parts and/or descriptions of those described above with regard to FIGS. 1 to 5 may be briefly explained or omitted.

Referring to FIG. 6, the substrate processing apparatus according to embodiments of the present inventive concept may further include a controller 228.

The controller 228 may be connected to the fan filter unit 200. The controller 228 may control a static pressure and/or velocity of airflow due to the fan filter unit 200. For example, the controller 228 may control the rotational speed of the centrifugal fan 220. If the fan filter unit 200 includes a plurality of centrifugal fans 220, the controller 228 may individually control the rotational speed of each centrifugal fan 220.

The controller 228 may be implemented as hardware, firmware, software, or any combination thereof. For example, the controller 228 may be a computing device such as a workstation computer, a desktop computer, a laptop computer, and a tablet computer. The controller 228 may be a simple controller, a complex processor such as a microprocessor, a CPU or a GPU, a processor configured by software, an exclusive hardware or firmware.

Referring to FIG. 7, in the substrate processing apparatus according to embodiments of the present inventive concept, the fan filter unit 200 may further include a pre-filter 260.

The pre-filter 260 may be disposed inside the housing 210. The pre-filter 260 may be disposed on the centrifugal fan 220 and the first plate 230. For example, the pre-filter 260 may overlap and be disposed above the centrifugal fan 220 and the first plate 230. For example, the pre-filter 260 may be disposed between the centrifugal fan 220 and the inlet 210H, and between the first plate 230 and the inlet 210H. The pre-filter 260 may prevent damage to the filter 250 due to debris and the like.

Referring to FIG. 8, in the substrate processing apparatus according to embodiments of the present inventive concept, a filter 250 may be disposed between the centrifugal fan 220 and the second plate 240, and between the first plate 230 and the second plate 240. The filter 250 may be spaced apart from the centrifugal fan 220 and the first plate 230 in the first direction Z.

Hereinafter, a method of processing a substrate according to an embodiment of the present inventive concept will be described with reference to FIGS. 1 to 11.

Figure 9:
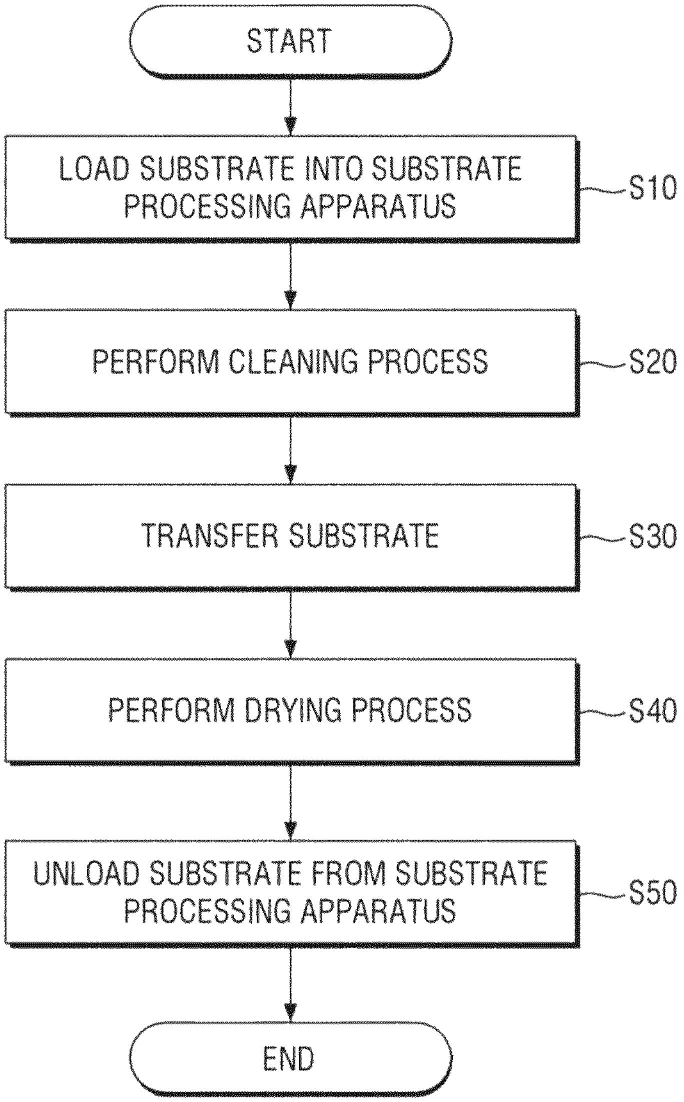
FIGS. 9, 10, and 11 are flowcharts explaining the method of processing a substrate according to embodiments of the present inventive concept.
Figure 10:
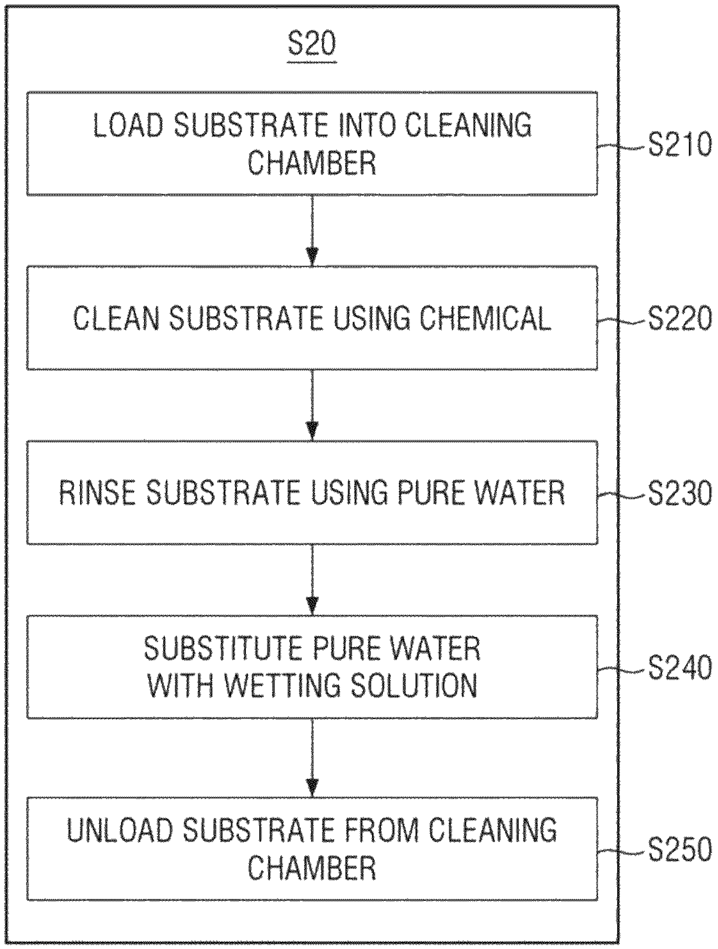
Figure 11:
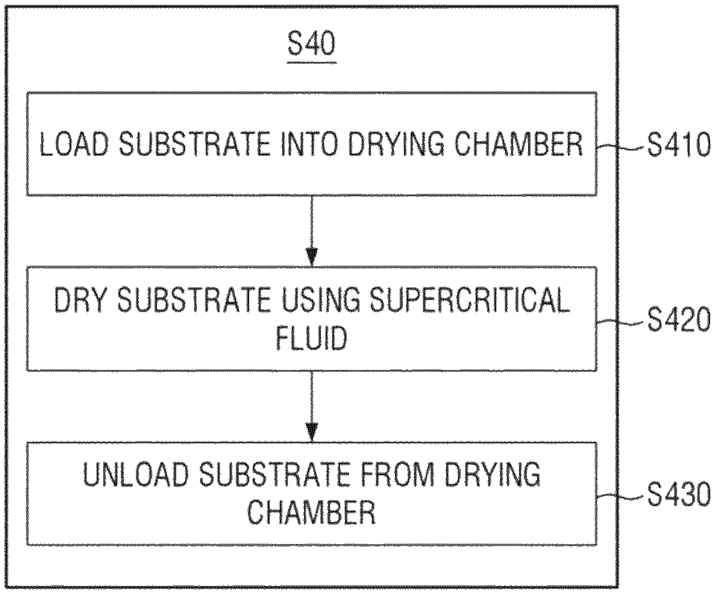

FIGS. 9 to 11 are flowcharts explaining the method of processing a substrate according to embodiments of the present inventive concept. For convenience of explanation, repeated parts and/or descriptions of those described above with regard to FIGS. 1 to 8 may be briefly explained or omitted.

Referring to FIG. 9, first, a substrate S is loaded into the substrate processing apparatus (S10). For example, as described above using FIG. 1, the substrate S may be loaded through the load port 40.

Subsequently, a cleaning process is performed on the substrate S (S20). For example, as described above using FIG. 1, the substrate S may be transferred to the first process module 10 through the interface module 50, the stage unit 60, and the transfer module 30. The first process module 10 may perform the cleaning process on the substrate S.

Subsequently, the substrate S is transferred (S30). For example, as described above using FIG. 1, the transfer module 30 may take out the substrate S from the first process module 10 and transfer it to the second process module 20.

Subsequently, a drying process is performed on the substrate S (S40). For example, as described above using FIG. 1, the second process module 20 may perform the drying process on the substrate S that has been subjected to the cleaning process.

Subsequently, the substrate S is unloaded from the substrate processing apparatus (S50). For example, as described above using FIG. 1, the substrate S may be transferred to the load port 40 through the transfer module 30, the stage unit 60, and the interface module 50. The substrate S may be unloaded through the load port 40.

Referring to FIG. 10, in the method of processing the substrate according to embodiments of the present inventive concept, performing the cleaning process on the substrate S (S20) includes loading the substrate S into the cleaning chamber (S210), cleaning the substrate S by using a chemical solution (S220), rinsing the substrate S by using pure water (S230), replacing the pure water with a wetting solution (e.g., IPA) (S240), and unloading the substrate S from the cleaning chamber (S250).

Referring to FIG. 11, in the method of processing the substrate according to embodiments of the present inventive concept, performing the drying process on the substrate S (S40) includes loading the substrate S into the drying chamber (S410), drying the substrate S by using a supercritical fluid (S420), and unloading the substrate S from the drying chamber (S430).

While the present inventive concept has been described with reference to embodiments thereof, it will be understood by those of ordinary skill in the art that various changes in form and details may be made thereto without departing from the spirit and scope of the present inventive concept.

What is claimed is:

1. A fan filter unit comprising: a housing; a centrifugal fan which rotates inside the housing about a rotary axis that extends in a first direction; a first plate surrounding at least a part of aside surface of the centrifugal fan; and a second plate disposed below the centrifugal fan and the first plate, and including a plurality of micro holes each extending in the first direction, wherein a first airflow path, which extends in the first direction, and a second airflow path, which is connected to a lower part of the first airflow path, are formed between the centrifugal fan and the first plate, and the second airflow path has an inclination with respect to a lower surface of the centrifugal fan: the first plate includes a first airflow hole and a second airflow hole, wherein the first airflow hole extends from an upper surface of the first plate, and the second airflow hole extends from a lower part of the first airflow hole to a lower surface of the first plate, the first airflow path is formed in the first airflow hole, the second airflow path is formed in the second airflow hole, and a width of the second airflow hole decreases, as the second airflow hole extends away from the first airflow hole.

2. The fan filter unit of claim 1, wherein the centrifugal fan includes a motor having the rotary axis, a blower that is rotated by the motor, and an airflow guide unit extending downward from a lower surface of the blower, the first airflow path is formed between the blower and the first plate, and the second airflow path is formed between the airflow guide unit and the first plate.

3. The fan filter unit of claim 2, wherein a width of the airflow guide unit decreases, as the airflow guide unit extends away from the lower surface of the blower.

4. The fan filter unit of claim 1, further comprising:

a filter disposed below the centrifugal fan and the first plate.

5. The fan filter unit of claim 4, wherein the filter is interposed between the first plate and the second plate.

6. The fan filter unit of claim 4, wherein the second plate is interposed between the first plate and the filter.

7. The fan filter unit of claim 1, wherein an acute angle that is formed between the lower surface of the first plate and the second airflow path is 200 to 45°.

8. The fan filter unit of claim 1, wherein a width of each of the plurality of micro holes is 5 mm or less.

9. The fan filter unit of claim 1, wherein a number of the plurality of micro holes is 10,000 or more per square meter.

10. A fan filter unit comprising:

a housing;

a centrifugal fan disposed inside the housing, and including a motor, a blower, and an airflow guide unit, wherein the motor has a rotary axis that extends in a first direction, wherein the blower is rotated by the motor, and the airflow guide unit includes a first inclined surface extending downward from an outer peripheral part of the blower;

a first plate including an opposite surface and a second inclined surface, wherein the opposite surface is opposite to a side surface of the blower, and the second inclined surface is opposite to the first inclined surface; and a second plate disposed below the centrifugal fan and the first plate, and including a plurality of micro holes each extending in the first direction, wherein a first interior angle that is formed between a lower surface of the airflow guide unit and the first inclined surface is an obtuse angle.

11. The fan filter unit of claim 10, wherein the first interior angle is between 135° and 160°.

12. The fan filter unit of claim 10, wherein a second interior angle that is formed by a lower surface of the first plate and the second inclined surface is an acute angle.

13. The fan filter unit of claim 12, wherein the second interior angle is between 20° and 45°.

14. The fan filter unit of claim 10, wherein a width of each of the plurality of micro holes is 5 mm or less, and a number of the plurality of micro holes is 10,000 or more per square meter.

15. The fan filter unit of claim 10, wherein a velocity of an airflow emitted from the plurality of micro holes in the first direction is 0.25 m/s or less.

16. A substrate processing apparatus comprising: a chamber body providing a process space; a substrate support configured to support a substrate, inside the process space; a processing liquid supply nozzle configured to supply a processing liquid onto the substrate; an exhaust port connected to the chamber body; and the fan filter unit of claim 10 connected to the chamber body, wherein the second plate is disposed between the process space and the centrifugal fan and between the process space and the first plate.

17. A substrate processing apparatus comprising: a chamber body providing a process space; a substrate support configured to support a substrate, inside the process space; a processing liquid supply nozzle configured to supply a processing liquid onto the substrate; an exhaust port connected to the chamber body; and the fan filter unit of claim 1 connected to the chamber body, wherein the second plate is disposed between the process space and the centrifugal fan and between the process space and the first plate.

18. The substrate processing apparatus of claim 17, wherein an acute angle that is formed between the lower surface of the first plate and the second airflow path is 200 to 45°.

19. The substrate processing apparatus of claim 17, wherein a width of each of the plurality of micro holes is 5 mm or less.

* * * * *